United States Patent [19]

Sano et al.

[11] Patent Number: 5,085,908

[45] Date of Patent: Feb. 4, 1992

[54] LIGHTSAFE MASKING FILM

[75] Inventors: Shinichi Sano, Satte; Hisashi Shimokawahara, Higashikatsushika; Hiroshi Maruyama, Misato, all of Japan

[73] Assignee: Somar Corporation, Japan

[21] Appl. No.: 305,129

[22] Filed: Feb. 2, 1989

[51] Int. Cl.$^5$ .................................................. B30B 7/06
[52] U.S. Cl. ...................................... 428/40; 428/518; 428/520; 428/522
[58] Field of Search ................. 428/40, 343, 518, 520, 428/522, 483, 42; 525/238, 239

[56] References Cited

U.S. PATENT DOCUMENTS

| | | | |
|---|---|---|---|
| 2,653,884 | 9/1953 | Hussey | 525/238 |
| 2,919,206 | 12/1959 | Malmquist | 525/239 |
| 3,288,888 | 11/1966 | Wieckowski | 525/239 |
| 3,662,028 | 5/1972 | Wineland | 525/239 |
| 3,892,900 | 7/1975 | Shima et al. | 428/40 |
| 4,925,713 | 5/1990 | Kiryu | 428/40 |

FOREIGN PATENT DOCUMENTS

| | | | |
|---|---|---|---|
| 0188292 | 7/1986 | European Pat. Off. | 428/343 |
| 7339096 | 7/1974 | France . | |

OTHER PUBLICATIONS

Patent Abstracts of Japan, vol. 7, No. 216, JP-A-58 108 537.

*Primary Examiner*—Jenna Davis
*Attorney, Agent, or Firm*—Lorusso & Loud

[57] ABSTRACT

A lightsafe masking film is disclosed which comprises a transparent substrate, and a transparent, lightsafe layer peelably provided over the surface of the substrate and containing (a) a nitrile rubber, (b) a vinyl chloride/vinylidene chloride copolymer having an average polymerization degree of 300–600 and a weight ratio of the vinyl chloride units to the vinylidene chloride units of 60:40 to 95:5, and (c) a lightsafe substance, the weight ratio of component (b) to component (a) being in the range of 50:50 to 95:5.

7 Claims, No Drawings

LIGHTSAFE MASKING FILM

This invention relates generally to a lightsafe masking film and, more specifically, to a composite, lightsafe masking film to be used as an original copy having a transparent pattern in the photomechanical reproduction process.

One known lightsafe masking film of this type is composed of a plastic film substrate and a peelable, lightsafe layer provided thereon. When a desired cutting line is formed on the lightsafe layer manually or with a suitable automatic cutting device and when the cut portion is removed by peeling, there is left a desired transparent pattern on the masking film.

The lightsafe layer is generally composed of a binder and a lightsafe substance such as a colorant capable of blocking light having a wavelength of 550 nm or less. As the binder, a combination of a vinyl chloride/vinyl acetate copolymer and a nitrile rubber has been conventionally used.

The present inventors, however, have found that the conventional binder has following defects:

(1) Since such a binder provides extremely tight bonding between the lightsafe layer and the substrate, it is difficult to peel off the lightsafe layer from the substrate, especially when the masking film has a large size. More specifically, it becomes difficult to separate and raise an edge of a cut lightsafe layer from the substrate even if a knife is used. It is also difficult and time-consuming to peel off the layer with fingers holding the raised edge portion, while preventing deformation or breakage of the cut layer to be peeled off.

(2) The peelability of the lightsafe layer using such a binder is susceptibile to environmental conditions such as temperature and humidity.

The present invention has been made with the foregoing drawbacks of the conventional lightsafe masking film in view and has its object the provision of an improved lightsafe masking film whose peelable lightsafe layer has both suitable peelability and adhesive property so that, when cut lines are formed in the lightsafe layer, that portion of the lightsafe layer to be removed can be easily raised in its corner edge with a knife and can be peeled off while the other portion of the lightsafe layer to be left as such can remain bonded to the substrate without spontaneously peeling off therefrom. In accordance with the present invention, there is provided a lightsafe masking film, comprising a transparent substrate, and a transparent, lightsafe layer peelably provided over the surface of the substrate and containing (a) a nitrile rubber, (b) a vinyl chloride/vinylidene chloride copolymer having an average polymerization degree of 300–600 and a weight ratio of the vinyl chloride units to the vinylidene chloride units of 60:40 to 95:5, and (c) a lightsafe substance, the weight ratio of component (b) to component (a) being in the range of 50:50 to 95:5.

The lightsafe layer of the masking film according to the present invention has an additional merit that it exhibits suitable peelability which does not vary with environmental conditions such as temperature and humidity.

The present invention will now be described in detail below.

Lightsafe masking film according to the present invention is comprised of a transparent substrate formed of a plastic material having provided thereon a peelable, transparent, lightsafe layer.

Any plastic material conventionally used as a transparent substrate in known lightsafe masking films can be used for the purpose of the present invention. Synthetic resin films, semisynthetic resin films and laminated films thereof may be used as the substrate. Illustrative of suitable synthetic resin films are those formed of a polyester such as polyethylene terephthalate or polybutylene terephthalate, an aromatic polyamide, an aliphatic polyamide, a polyolefin such as polyethylene or polypropylene, a polystyrene, a polycarbonate, a polyvinyl chloride and a polyvinylidene chloride. Illustrative of a suitable semisynthetic resin film is that formed of a cellulose acetate. Examples of the laminated films include those using a combination of synthetic resin layers, a combination of synthetic resin and semisynthetic resin layers, a combination of a cellulose layer and a synthetic resin layer and/or a semisynthetic resin layer. Above all, a polyethylene terephalate film is an especially preferred substrate for reasons of excellent dimensional stability and excellent tensile strength and tearing strength. The thickness of the film is generally in the range of 20–300 $\mu$m, preferably 50–250 $\mu$m. Both stretched and non-stretched films may be used as the substrate.

The substrate is overlaid with a peelable, lightsafe layer generally composed of a binder and a lightsafe or light-shading substance.

It is important that a combination of a nitrile rubber and a vinyl chloride/vinylidene chloride copolymer having an average polymerization degree of 300–600 and a weight ratio of the vinyl chloride units to the vinylidene chloride units of 60:40 to 95:5 should be used as the binder. If other copolymers such as vinyl chloride/vinyl acetate and vinyl chloride/ethylene copolymers are used as the binder, the object of the present invention cannot be accomplished.

When the proportion of the vinylidene chloride in the copolymer exceeds 40% by weight, the resulting lightsafe layer becomes tacky. A proportion of the vinylidene chloride below 5% by weight, on the other hand, is disadvantageous because the lightsafe layer becomes so rigid that it is apt to be cracked during peeling operation. The vinyl chloride/vinylidene chloride copolymer preferably has a weight ratio of the vinyl chloride to vinylidene chloride of 70:30 to 90:10.

Too high an average polymerization degree in excess of 600 causes lowering of the solubility of the polymer so that it becomes difficult to prepare a coating liquid for the formation of the lightsafe layer. In addition, since the coating liquid becomes high in viscosity, it is difficult to form a uniformly coated lightsafe layer on the substrate. A polymerization degree of below 300 is also disadvantageous because the resulting lightsafe layer is weak and is apt to be broken during a peeling stage. Preferred average polymerization degree ranges from 400 to 500.

The vinyl chloride/vinylidene chloride copolymer to be used as the binder may contain other copolymerizable monomer or monomers and may be a terpolymer or a multicomponent copolymer as long as the amount of such copolymerized monomer or monomers is small and as long as the objects of the present invention are accomplished.

The nitrile rubber to be used in conjunction with the above copolymer is of a type which is composed mainly of butadiene and acrylonitrile as its main components.

An acrylonitrile/butadiene copolymer and a terpolymer of acrylonitrile, butadiene and a carboxyl group-containing monomer are illustrative of such nitrile rubber. The acrylonitrile content of the nitrile rubber is preferably 18–53% by weight, more preferably 25–43% by weight.

The weight ratio of the copolymer to the nitrile rubber is generally 50:50 to 95:5, preferably 60:40 to 90:10. Too low a weight ratio below 50:50 causes an excessive increase of the binding strength between the layer and the substrate, a decrease of rigidity of the layer, an increased tendency to deform and an increase of the surface tackiness. On the other hand, when the weight ratio exceeds 95:5, the binding force becomes small and the layer becomes apt to be broken.

The kind and color of the lightsafe substance to be incorporated into the lightsafe layer are not specifically limited as long as the resulting lightsafe layer can block light having a wavelength of 300–550 nm. Red, yellow or amber colorants of an oil-soluble type, a direct dye-type, a reaction-type or an acidic-type may be suitably used. Two or more colorants can be used in combination. Colorant soluble in an organic solvent is generally used for reasons of easiness of formation of the lightsafe layer on the substrate. The lightsafe substance is used in an amount so that the resulting lightsafe layer can block light having a wavelength of 300–550 nm.

The lightsafe layer may further contain one or more additives, such as a filler, a leveling agent, a blocking-preventing agent and a plasticizer, used in conventional masking films, if desired.

The lightsafe layer may be prepared by any known manner such as by applying a coating composition containing the above ingredients on the surface of the substrate. A solvent such as an alcohol, an ester, a hydrocarbon, a halogenated hydrocarbon, a ketone or the like organic solvent can be used for the formation of the coating composition. The lightsafe layer generally has a thickness of 10–50 μm, preferably 20–30 μm.

The following examples will further illustrate the present invention. In the examples, "part" is by weight. The test methods and evaluation of the test results in the following examples are as follows:

(1) Light-Blocking Property

Whether or not a lightsafe masking film can block a light with a wavelength of 300–550 nm is examined using a spectrophotometer UV-240 (Shimadzu Seisakusho K. K.).

(2) Peelability

Lightsafe layer of sample masking film is cut with a cutter knife both laterally and longitudinally to form square patterns having a length of the side of 10 cm. One of the squares is peeled off with fingers from its corner. Peelability is evaluated in terms of bonding of the lightsafe layer to the substrate film and rated as follows:
5: very excessively strong.
4: slightly excessively strong.
3: moderate.
2: slightly excessively weak.
1: very excessively weak.

(3) Capability of Raising Up

Sample masking film is cut in the same manner as (2) above and a corner of the square is raised with the cutter knife. Capability of raising is evaluated in terms of easiness of raising the corner and is rated as follows:
3: Easy to raise.
2: Slightly difficult to raise.
1: Difficult to raise.

(4) Suscesibility to Temperature

Two same masking films are allowed to stand for 24 hours at 30° C. and 50% relative humidity and at 10° C. and 50% relative humidity. Peelability is then measured in the same manner as (2) above. Suscesibility is evaluated in terms of difference in peelability between the two films and is rated as follows:
3: Not susceptible (slight or no difference exists).
2: Slightly susceptible (fair difference exists).
1: Very susceptible (large difference exists).

(5) Bonding Strength

Using a surface property measuring machine (Shintoh Manufacturing K. K.), a force required for peeling off the lightsafe layer is measured.

(6) Blocking Tendency

Two masking films are superimposed with the substrate of the upper masking film contacting with the lightsafe layer of the lower masking film. The two films are then allowed to stand at a temperature of 25° C. and a relative humidity of 50% for 24 hours while applying a load of 30 kg/m$^2$ to the films. Tendency of the films to stick to each other at their contact is examined and is rated as follows:
3: No blocking.
2: Blocking occurs partly.
1: Blocking occurs entire area.

(7) Cracking Tendency

Tendency of lightsafe layer to crack during peeling is checked and is rated as follows:
3: No cracking.
2: Partly cracked.
1: Easily cracks.

EXAMPLE 1

A coating composition was obtained by homogeneously mixing 17 parts a vinyl chloride/vinylidene chloride copolymer (weight ratio of the former to the latter: 80/20 (wt/wt), average polymerization degree: 430), 4 parts of an acrylonitrile/butadiene copolymer (acrylonitrile content: 33% by weight), 2 parts of a metal complex dye (Valiozol Orange 3209T), 0.1 part of an organopolysiloxane (KP356, Shinetsu Kagaku K. K.) 0.5 part of synthetic silica and 76.4 parts of methyl ethyl ketone. The coating composition was then uniformly applied over the surface of a polyethylene film (thickness: 75 μm) by a roll coater method and the coat was dried at 100° C. to obtain a masking film composed of the polyethylene film substrate having provided thereon a lightsafe layer with a thickness of 25 μm. The resulting masking films was then tested to obtain the results summarized in Table 1 below.

REFERENCE EXAMPLE 1

Example 1 was repeated in the same manner as described except that 15 parts of a vinyl chloride/vinyl acetate copolymer (weight ratio of the former to the latter: 86:14 (wt/wt), average polymerization degree: 430) were used in place of the 17 parts of the vinyl chloride/vinylidene chloride copolymer and that the amount of the acrylonitrile/butadiene copolymer was increased to 6 parts. Test results for the resulting masking film are shown in Table 1.

TABLE 1

| | Example 1 | Reference Example 1 |
|---|---|---|
| Copolymer | Vinyl chloride/vinylidene chloride copolymer | Vinyl chloride/vinyl acetate copolymer |
| Light-blocking property | good | good |
| Peelability | 3 (moderate) | 5 (very excessively strong) |
| Capability of Raising-up | 3 (easy) | 2 (slightly difficult) |
| Susceptibility to temperature | 3 (not susceptible) | 1 (very susceptible) |

EXAMPLES 2 AND 3

Example 1 was repeated in the same manner as described except that the amounts of the vinyl chloride/vinylidene chloride copolymer and acrylonitrile/butadiene rubber were changed to 3 parts and 18 parts, respectively (Example 2) and 5 parts and 16 parts, respectively (Example 3). The test results of these masking films are summarized in Table 2 together with those of the masking film of Example 1. In Table 2, the abbreviations are as follows:

NBR: acrylonitrile/butadiene copolymer.
VC/VDC: vinyl chloride/vinylidene chloride copolymer.

TABLE 2

| Example | 1 | 2 | 3 |
|---|---|---|---|
| NBR | 4 | 3 | 5 |
| VC/VDC | 17 | 18 | 16 |
| Bonding strength (g/cm) | ca. 100 | ca. 70 | ca. 130 |

TABLE 2-continued

| Example | 1 | 2 | 3 |
|---|---|---|---|
| Blocking tendency | 3 (no blocking) | 3 (no blocking) | 2 (partly) |
| Peelability | 3 (moderate) | 2 (slightly weak) | 4 (slightly strong) |
| Capability of raise-up | 3 (easy) | 3 (easy) | 2 (slightly difficult) |
| Cracking tendency | 3 (no crack) | 2 (partly) | 3 (no crack) |

What is claimed is:

1. A lightsafe masking film, comprising a transparent substrate, and a transparent, lightsafe layer peelably provided over the surface of the substrate and containing (a) a nitrile rubber, (b) a vinyl chloride/vinylidene chloride copolymer having an average polymerization degree of 300–600 and a weight ratio of the vinyl chloride units to the vinylidene chloride units of 60:40 to 95:5, and (c) a lightsafe substance, the weight ratio of component (b) to component (a) being in the range of 50:50 to 95:5, said lightsafe layer blocking light having a wavelength of 300–550 nm.

2. A lightsafe masking film as set forth in claim 1, wherein the weight ratio of the vinyl chloride units to the vinylidene chloride units is 70:30 to 90:10.

3. A lightsafe masking film as set forth in claim 1, wherein said nitrile rubber is a polymer containing butadiene and acrylonitrile as its monomer unit.

4. A lightsafe masking film as set forth in claim 3, wherein said polymer is an acrylonitrile/butadiene copolymer or a terpolymer of acrylonitrile, butadiene and a carboxyl group-containing copolymerizable monomer.

5. A lightsafe masking film as set forth in claim 4, wherein said polymer has an acrylonitrile content of 18–53% by weight.

6. A lightsafe masking film as set forth in claim 1, wherein the weight ratio of component (b) to component (a) is in the range of 60:40 to 90:10.

7. The lightsafe masking film of claim 1 wherein the ratio of component (b) to component (a) is 16:5 to 95:5.

* * * * *